United States Patent
Gowda et al.

(10) Patent No.: US 8,853,550 B2
(45) Date of Patent: *Oct. 7, 2014

(54) CIRCUIT BOARD INCLUDING MASK FOR CONTROLLING FLOW OF SOLDER

(75) Inventors: Arun Virupaksha Gowda, Niskayuna, NY (US); Kevin Matthew Durocher, Waterford, NY (US); James Wilson Rose, Guilderland, NY (US); Paul Jeffrey Gillespie, Scotia, NY (US); Richard Alfred Beaupre, Pittsfield, MA (US); David Richard Esler, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/035,127

(22) Filed: Feb. 25, 2011

(65) Prior Publication Data

US 2011/0139495 A1 Jun. 16, 2011

Related U.S. Application Data

(62) Division of application No. 11/746,260, filed on May 9, 2007, now Pat. No. 7,919,714.

(51) Int. Cl.
| | |
|---|---|
| H05K 1/03 | (2006.01) |
| H05K 3/34 | (2006.01) |
| B23K 35/30 | (2006.01) |
| B23K 35/36 | (2006.01) |
| B23K 35/38 | (2006.01) |
| B23K 35/28 | (2006.01) |
| B23K 35/32 | (2006.01) |
| B23K 3/06 | (2006.01) |
| H05K 3/24 | (2006.01) |
| H05K 3/00 | (2006.01) |

(52) U.S. Cl.
CPC ............... *B23K 3/06* (2013.01); *H05K 3/3452* (2013.01); *H05K 3/244* (2013.01); *H05K 3/0061* (2013.01); *B23K 35/308* (2013.01); *B23K 35/3606* (2013.01); *B23K 35/38* (2013.01); *B23K 35/286* (2013.01); *B23K 35/325* (2013.01); *H05K 2201/2081* (2013.01)
USPC .......................................... 174/255; 174/260

(58) Field of Classification Search
CPC ...... B23K 3/06; B23K 35/308; B23K 35/325; B23K 35/38; B23K 35/3606; H05K 2201/2081; H05K 3/0061; H05K 3/24
USPC ....................... 228/180.1, 180.21, 180.22, 39
See application file for complete search history.

(56) References Cited

U.S. PATENT DOCUMENTS

| | | | |
|---|---|---|---|
| 2,473,887 A | | 6/1949 | Jennings et al. |
| 3,809,011 A | | 5/1974 | Fabre et al. |
| 4,311,266 A | | 1/1982 | Kondo |
| 4,420,110 A | | 12/1983 | McCullough et al. |
| 4,682,723 A | | 7/1987 | Grummett |
| 4,739,919 A | | 4/1988 | Van Den Brekel et al. |
| 4,842,699 A | * | 6/1989 | Hua et al. ...................... 205/126 |
| 4,988,412 A | | 1/1991 | Liu et al. |
| 5,964,395 A | * | 10/1999 | Glovatsky et al. ......... 228/123.1 |
| 6,008,071 A | * | 12/1999 | Karasawa et al. ............. 438/115 |

(Continued)

*Primary Examiner* — Ishwarbhai B Patel
(74) *Attorney, Agent, or Firm* — Seema S. Katragadda

(57) ABSTRACT

A circuit board includes a solder wettable surface and a metal mask configured to restrict solder from flowing outside the solder wettable surface of the circuit board.

4 Claims, 4 Drawing Sheets

(56) References Cited

U.S. PATENT DOCUMENTS

| | | |
|---|---|---|
| 6,228,466 B1 * | 5/2001 | Tsukada et al. ............... 428/209 |
| 6,329,605 B1 | 12/2001 | Beroz et al. |
| 6,960,822 B2 | 11/2005 | Ding et al. |
| 7,485,563 B2 | 2/2009 | Pang et al. |
| 7,554,039 B2 * | 6/2009 | Yokozuka et al. ............ 174/252 |
| 7,919,714 B2 * | 4/2011 | Gowda et al. ................ 174/252 |
| 2006/0061630 A1 | 3/2006 | Birkmeyer et al. |
| 2006/0255102 A1 * | 11/2006 | Snyder et al. ................ 228/203 |

* cited by examiner

CIRCUIT BOARD INCLUDING MASK FOR CONTROLLING FLOW OF SOLDER

CROSS REFERENCE TO RELATED APPLICATIONS

"This Application is a divisional of U.S. Pat. No. 7,919,714 now issued for the application Ser. No. 11/746,260, entitled "SYSTEM AND METHOD FOR CONTROLLING FLOW OF SOLDER", by Arun V. Gowda et al. filed on May 9, 2007, which is herein incorporated by reference."

BACKGROUND

The disclosed embodiments relate generally to applications wherein a solder is used as an interconnect, and, more particularly, to systems and methods to restrict flow of solder from protected areas in such applications.

Generally, a low melting point filler material such as a solder is used as a joining material or an interconnect between metal components in various applications. For example, in mass production of electronic circuit boards, soldering machines have been developed of a standing wave type wherein a conveyor system carries the circuit boards with electrical components disposed therein over a standing wave of molten solder. The solder fills voids between the electrical components to be joined on the circuit board and completes all of the soldering operations in one pass of the board through the standing wave of solder. However, it is desirable to avoid contact of other components in the circuit board with the solder wave and prevent unwanted wetting of the components in a soldering process.

Solder masks are typically made of an organic material and configured to expose areas that are to be soldered and areas that are to be protected. The thickness of such a mask typically varies from about twenty five microns to about fifty microns and introduces a step between a solderable surface and a protected surface. However, the step is undesirable in certain applications since the step may act as a stress concentrator at locations wherein a joint of the solder deforms around the step. Further, typical organic solder masks cannot withstand temperatures higher than about 200 degrees Celsius for extended periods of time.

Accordingly, an improved technique is needed to address one or more of the foregoing issues.

BRIEF DESCRIPTION

In accordance with an embodiment disclosed herein, an assembly including a solder wettable surface is provided. The assembly also includes a metal mask configured to restrict solder from flowing outside the solder wettable surface.

In accordance with another embodiment disclosed herein, a method for controlling flow of solder is provided. The method includes forming a metal mask so as to enable a flow of a solder to a solderable area and restrict flow of the solder from reaching a protected area. The method also includes soldering the solderable area.

In accordance with another embodiment disclosed herein, a heat sink assembly is provided. The heat sink assembly includes a solder wettable surface. The heat sink assembly also includes a metal mask configured to restrict solder from flowing outside the solder wettable surface of the heat sink assembly.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present invention include a system, a method for controlling flow of solder, and an assembly including a metal mask formed thereon. The term "controlling" refers to restricting the flow of solder from reaching at least one protected area and confining the solder to at least one solder wettable area. Further, as used herein, the term "metal mask" refers to a metal that is formed to prevent the solder from flowing into a protected area.

Figure 1:
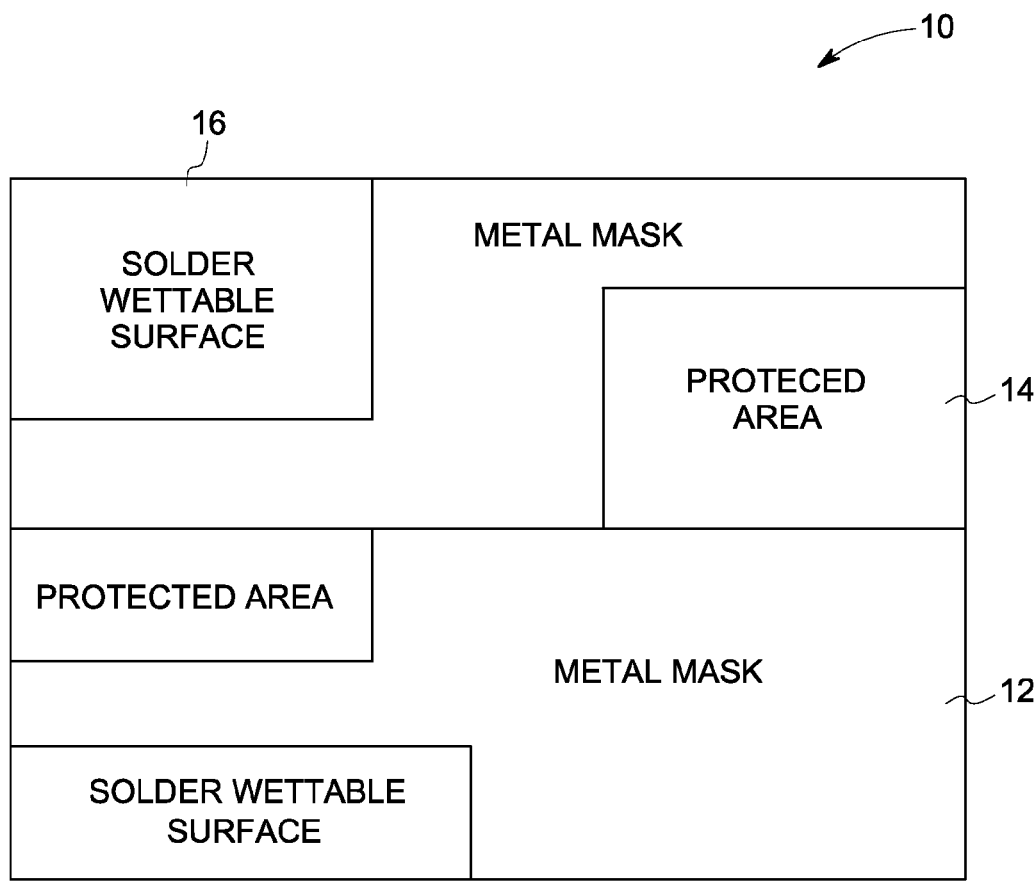
FIG. 1 is a block diagram representation of a metal mask formed on a substrate in accordance with embodiments disclosed herein.

FIG. 1 is a block diagram representation of a substrate 10 and a metal mask 12 formed thereon. The substrate 10 includes at least one protected area 14 and at least one solder wettable surface 16. The metal mask 12 restricts flow of solder from the solder wettable surface 16 to the protected area 14. In a presently illustrated embodiment, the metal mask 12 is formed between the solder wettable surface and the protected area. In another embodiment, the metal mask 12 may be formed over the protected area 14.

The metal mask 12 comprises elements that prevent the solder from metallurgically bonding to it. Non-limiting examples of the metal mask 12 include a group of elements consisting of titanium, tungsten, tantalum, chromium, aluminum, and combinations thereof. Metal mask 12 may additionally or alternatively include oxides and nitrides of the aforementioned elements. Using metal masks is useful because such masks can be effective with lower thicknesses than conventional solder masks. For example, in one embodiment, a thickness of the metal mask 12 may be less than or equal to about 125 microns. In a particularly useful embodiment, metal mask 12 comprises a metal material that, when oxidized, does not reduce back to a metal state on reacting with a solder. This prevents the solder from sticking on to the metal mask 12. Non-limiting examples of such materials that do not diffuse into a solder wettable surface that is deposited with gold include titanium, chromium and tungsten. Further, the metal mask 12 should withstand high temperatures and in one example can withstand a temperature of at least about 300 degrees Celsius.

Figure 2:
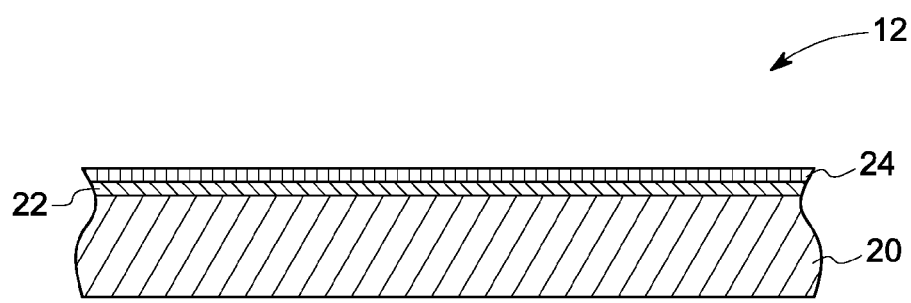
FIG. 2 is a sectional view of the metal mask in FIG. 1.

FIG. 2 is a sectional view of the metal mask 12 in FIG. 1. The metal mask 12 includes a deposition of gold as a base layer 20. Some non-limiting examples of a composition of the base layer 20 include nickel, copper, tin, silver and palladium. The metal mask 12 also includes a metal layer 22 deposited on the base layer 20. Various metals may be used in the layer 22 depending on compatibility with the base layer 20. The metals used are those referred to in FIG. 1. Further, a layer of an oxide 24 of the metal used in layer 22 may be formed on the metal layer 22. In an example, thickness of the base layer 20 is about 0.000001 inch to about 10 inches. In another example, thickness of the layer 22 is about 10 nm to about 100 microns.

Figure 3:
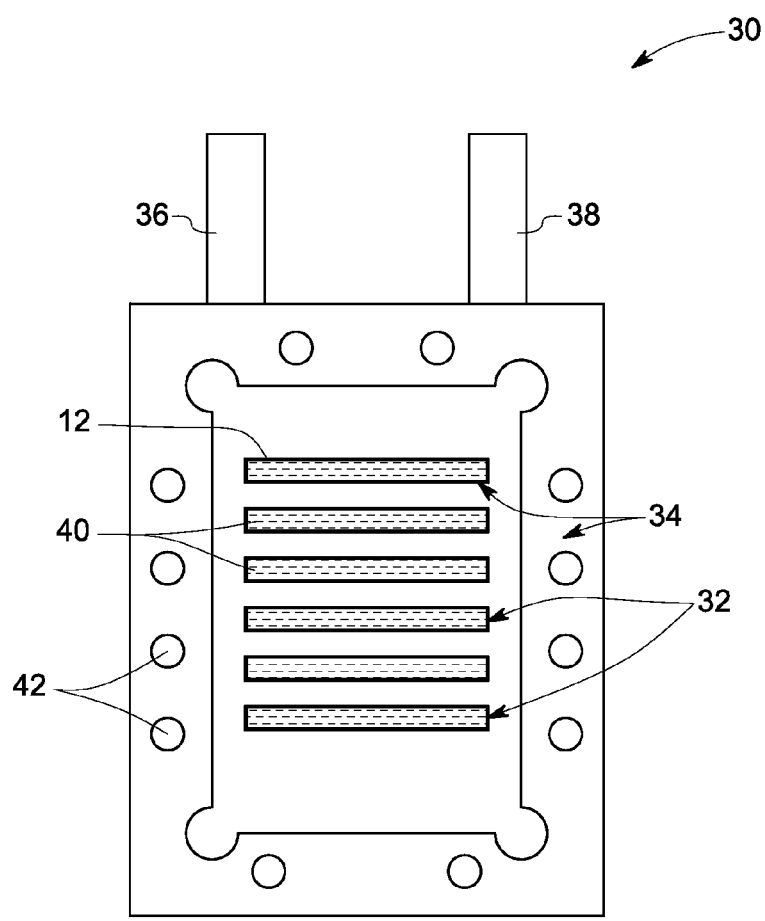
FIG. 3 is a schematic view of a metal mask formed on a heat sink assembly in accordance with embodiments disclosed herein.

FIG. 3 is a schematic view of a heat sink assembly 30 including a metal mask 12. The heat sink assembly 30 includes multiple channels 32 to provide a flow of a cooling fluid 40 as a means to extract heat from a substrate assembly described below in FIG. 4. The metal mask 12 may be sputtered at various locations 34. The channels 32 that are sputtered with the metal mask 12 are protected from accumulation of unwanted solder that may block the flow of the cooling fluid 40. Any of the materials and material properties described above with respect to FIGS. 1 and 2 are additionally applicable to the examples of FIGS. 2-4. In a more particular embodiment, the metal mask 12 of FIG. 2 comprises titanium. The heat sink assembly 30 also includes an inlet 36 and an outlet 38 for the cooling fluid 40. Holes 42 provide means for an external mechanical connection of the heat sink assembly 30.

Figure 4:
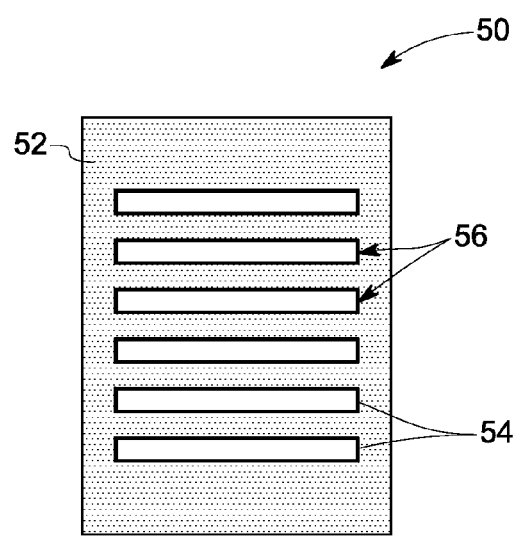
FIG. 4 is a schematic view of a metal mask formed on a substrate that is attached to the heat sink assembly in FIG. 3 in accordance with embodiments disclosed herein.

FIG. 4 is a schematic illustration of a substrate assembly 50 configured for being soldered to the heat sink assembly 30 in FIG. 3. The substrate 50 includes a solder wettable surface 52. In a particular embodiment, the solder wettable surface includes surface deposition of gold. A metal mask 54 is further formed on the substrate 50 at locations 56 corresponding to the channels 32 in FIG. 3 to prevent blockage of flow of the cooling fluid due to a solder. The substrate 50 is attached on top of the heat sink assembly in FIG. 3 such that the locations 56 coincide with the channels 32.

Figure 5:
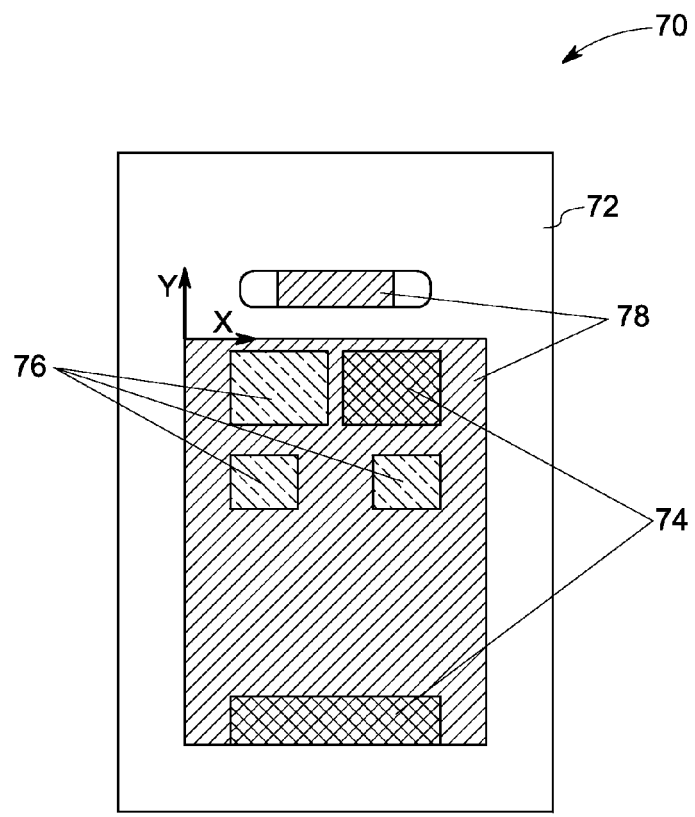
FIG. 5 is a schematic view of a metal mask on a circuit board for attachment of electronic devices in accordance with embodiments disclosed herein.

FIG. 5 is a schematic view of an exemplary circuit board 70. The circuit board 70 includes a substrate 72 for attachment of electrical components. Substrate 72 has multiple solder wettable surfaces 74. In a particular embodiment, the substrate 72 is made of silicon nitride. In another embodiment, the solder wettable surfaces 74 include a surface deposition of gold. A metal mask 78 may be formed at various locations so as to form the multiple protected areas 76. The metal mask 78 restricts flow of the solder from the solder wettable surfaces 74 to the protected areas 76. A coating of metal mask 12 at various locations prevents undesirable collection of solder on the electrical components or leads of the electrical components.

Figure 6:
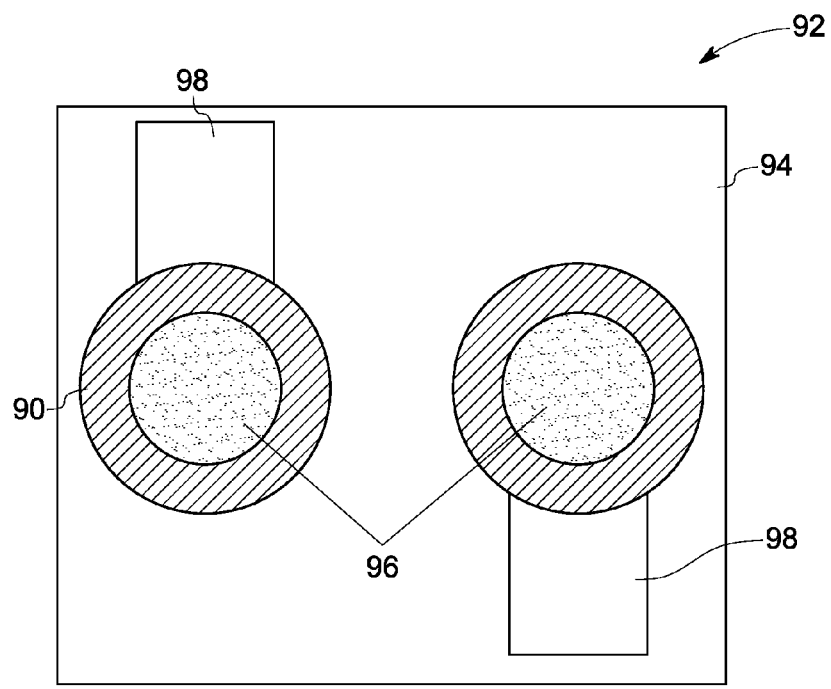
FIG. 6 is a schematic illustration of another exemplary embodiment of a metal mask on a circuit board for attachment of electronic devices in accordance with embodiments disclosed herein.

FIG. 6 is a schematic view of another exemplary configuration of a formation of a metal mask 90 on a circuit board 92. The circuit board 92 includes a substrate 94 for attachment of electrical and electronic components. In a particular embodiment, the substrate includes an epoxy laminate or a ceramic or other dielectric material. The substrate 94 includes multiple solder wettable surfaces 96. In the illustrated embodiment, the multiple solder wettable surfaces 96 are adjacent to each other and shown circular. The metal mask 90 is formed concentric around the solder wettable surfaces 96. Such a formation prevents shorting of electronic components soldered on the solder wettable surface 96. A trace or electrical wiring connection 98 is provided beneath a layer of the metal mask 90.

Figure 7:
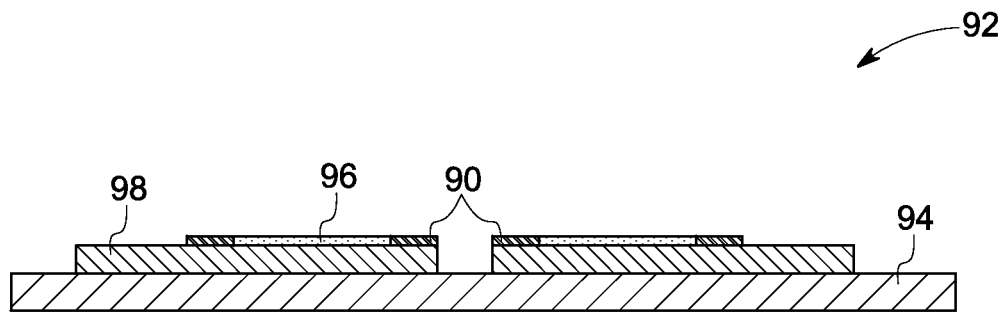
FIG. 7 is a cross-sectional view of the circuit board in FIG. 6.

FIG. 7 is a cross-sectional view of the circuit board 92 in FIG. 6. A layer of substrate 94 is formed on the circuit board 92. A trace 98 as referenced in FIG. 6 is formed on the substrate 94. Further, a metal mask layer 90 is formed around solder wettable surface 96 that are adjacent to each other.

Figure 8:
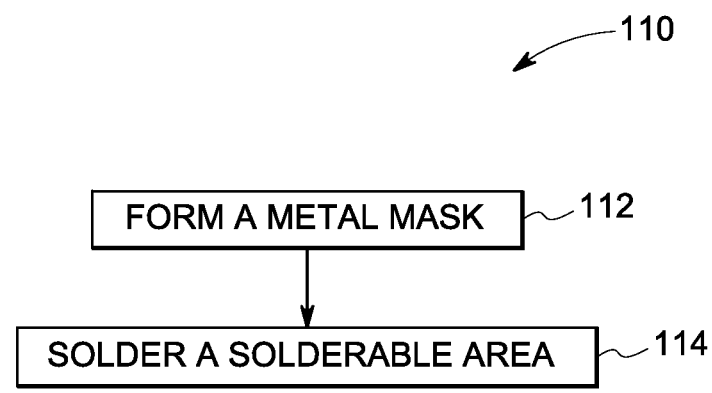
FIG. 8 is a flow chart representing exemplary steps in a method for providing a metal mask in accordance with embodiments disclosed herein.

FIG. 8 is a flow chart representing steps in an exemplary method 110 for controlling flow of solder. The method 110 includes forming a metal mask in step 112. Some of the non-limiting examples of forming the metal mask include sputtering, evaporation, plasma deposition, electroplating, electroless plating and backsputter etch processing. A component is further soldered in a solderable area in step 114.

The various embodiments of a system and a method for controlling flow of solder described above thus provide an efficient way to solder an assembly. These techniques and systems also allow for highly compact heat sink assemblies and circuit boards due to improved soldering mechanism.

Of course, it is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

Furthermore, the skilled artisan will recognize the interchangeability of various features from different embodiments. The various features described, as well as other known equivalents for each feature, can be mixed and matched by one of ordinary skill in this art to construct additional systems and techniques in accordance with principles of this disclosure.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A circuit board comprising:
   a solder wettable surface; and
   a metal mask comprising a base layer comprising gold, nickel, copper, tin, silver, and palladium, and wherein the metal mask is configured to restrict solder from flowing outside the solder wettable surface of the circuit board.

2. The circuit board of claim 1, further comprising a protected area, wherein the metal mask restricts flow of the solder from the solder wettable surface to the protected area.

3. The circuit board of claim 1, wherein the metal mask is selected from the group consisting of titanium, tungsten, chromium, aluminum, tantalum and combinations and alloys thereof.

4. The circuit board of claim 1, wherein the metal mask comprises an oxide of a metal selected from the group consisting of titanium, tungsten, chromium, aluminum, and combinations thereof.

* * * * *